(12) United States Patent
Wang

(10) Patent No.: US 10,200,030 B2
(45) Date of Patent: Feb. 5, 2019

(54) PARALLELING OF SWITCHING DEVICES FOR HIGH POWER CIRCUITS

(71) Applicant: Transphorm Inc., Goleta, CA (US)

(72) Inventor: Zhan Wang, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 15/554,170

(22) PCT Filed: Mar. 11, 2016

(86) PCT No.: PCT/US2016/022214
§ 371 (c)(1),
(2) Date: Aug. 28, 2017

(87) PCT Pub. No.: WO2016/149146
PCT Pub. Date: Sep. 22, 2016

(65) Prior Publication Data
US 2018/0083617 A1    Mar. 22, 2018

Related U.S. Application Data

(60) Provisional application No. 62/133,253, filed on Mar. 13, 2015.

(51) Int. Cl.
*H02P 27/08* (2006.01)
*H03K 17/687* (2006.01)
(Continued)

(52) U.S. Cl.
CPC .......... *H03K 17/6874* (2013.01); *H02M 1/08* (2013.01); *H02P 27/08* (2013.01);
(Continued)

(58) Field of Classification Search
CPC .............................. H02P 27/08; H03K 17/6874
(Continued)

(56) References Cited

U.S. PATENT DOCUMENTS

| 4,321,489 A | 3/1982 | Higuchi et al. |
| 4,384,287 A | 5/1983 | Sakuma |

(Continued)

FOREIGN PATENT DOCUMENTS

| CN | 1682445 | 10/2005 |
| CN | 1921148 | 2/2007 |

(Continued)

OTHER PUBLICATIONS

Authorized officer Keon Hyeong Kim, International Search Report and Written Opinion in PCT/US2008/076160 dated Mar. 18, 2009, 11 pages.

(Continued)

*Primary Examiner* — David S Luo
(74) *Attorney, Agent, or Firm* — Fish & Richardson P.C.

(57) ABSTRACT

A circuit includes first and second half bridges, a first inductor, a second inductor, and a main inductor. The half bridges each include a high side switch, a low side switch, and a gate driver configured to apply switching signals to the high side switch and the low side switch. The first inductor has one side electrically connected to an output node of the first half bridge between the high side switch and the low side switch. The second inductor has one side electrically connected to an output node of the second half bridge between the high side switch and the low side switch. The main inductor is coupled to a node between the other sides of the first and second inductors. The main inductor has a greater inductance than each of the first and second inductors, and the first and second inductors are inversely coupled to one another.

19 Claims, 10 Drawing Sheets

(51) Int. Cl.
*H03K 17/12* (2006.01)
*H03K 17/16* (2006.01)
*H03K 17/64* (2006.01)
*H02M 1/08* (2006.01)
*H01L 29/20* (2006.01)
*H01L 29/778* (2006.01)
*H02M 7/5395* (2006.01)
*H02M 1/00* (2006.01)

(52) U.S. Cl.
CPC ......... *H03K 17/122* (2013.01); *H03K 17/162* (2013.01); *H03K 17/164* (2013.01); *H03K 17/64* (2013.01); *H01L 29/2003* (2013.01); *H01L 29/7787* (2013.01); *H02M 7/5395* (2013.01); *H02M 2001/0054* (2013.01)

(58) Field of Classification Search
USPC .................................................. 318/474, 445
See application file for complete search history.

(56) References Cited

U.S. PATENT DOCUMENTS

| | | | |
|---|---|---|---|
| 4,665,508 A | 5/1987 | Chang | |
| 4,728,826 A | 3/1988 | Einzinger et al. | |
| 4,808,853 A | 2/1989 | Taylor | |
| 4,864,479 A | 9/1989 | Steigerwald et al. | |
| 5,198,964 A | 3/1993 | Ito et al. | |
| 5,379,209 A | 1/1995 | Goff | |
| 5,493,487 A | 2/1996 | Close et al. | |
| 5,637,922 A | 6/1997 | Fillion et al. | |
| 5,767,573 A | 6/1998 | Noda et al. | |
| 5,789,951 A | 8/1998 | Shen et al. | |
| 5,952,856 A | 9/1999 | Horiguchi et al. | |
| 6,008,684 A | 12/1999 | Ker et al. | |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,434,019 B2 | 8/2002 | Baudelot et al. | |
| 6,455,905 B1 | 9/2002 | Perugupalli et al. | |
| 6,521,940 B1 | 2/2003 | Vu et al. | |
| 6,556,053 B2 | 4/2003 | Stanley | |
| 6,633,195 B2 | 10/2003 | Baudelot et al. | |
| 6,650,169 B2 | 11/2003 | Faye et al. | |
| 6,781,423 B1 | 8/2004 | Knoedgen | |
| 6,864,131 B2 | 3/2005 | Thornton | |
| 6,876,235 B2 | 4/2005 | Li et al. | |
| 6,900,657 B2 | 5/2005 | Bui et al. | |
| 6,975,023 B2 | 12/2005 | Oliver et al. | |
| 7,116,567 B2 | 10/2006 | Shelton et al. | |
| 7,193,396 B2 | 3/2007 | Orr | |
| 7,199,636 B2 | 4/2007 | Oswald et al. | |
| 7,199,640 B2 | 4/2007 | De Cremoux et al. | |
| 7,212,063 B2 | 5/2007 | Münzer | |
| 7,227,198 B2 | 6/2007 | Pavier et al. | |
| 7,239,108 B2 | 7/2007 | Best | |
| 7,304,331 B2 | 12/2007 | Saito et al. | |
| 7,348,687 B2 | 3/2008 | Aichriedler et al. | |
| 7,368,980 B2 | 5/2008 | Benelbar et al. | |
| 7,375,407 B2 | 5/2008 | Yanagihara et al. | |
| 7,378,883 B1 | 5/2008 | Hsueh | |
| 7,382,001 B2 | 6/2008 | Beach | |
| 7,417,257 B2 | 8/2008 | Beach et al. | |
| 7,443,648 B2 | 10/2008 | Cutter et al. | |
| 7,449,730 B2 | 11/2008 | Kuraguchi | |
| 7,453,107 B1 | 11/2008 | Kapoor | |
| 7,465,997 B2 | 12/2008 | Kinzer et al. | |
| 7,477,082 B2 | 1/2009 | Fukazawa | |
| 7,482,788 B2 | 1/2009 | Yang | |
| 7,501,669 B2 | 3/2009 | Parikh et al. | |
| 7,522,435 B2 | 4/2009 | Kohnotoh et al. | |
| 7,538,366 B2 | 5/2009 | Saito et al. | |
| 7,547,964 B2 | 6/2009 | Pavier et al. | |
| 7,548,112 B2 | 6/2009 | Sheppard | |
| 7,550,781 B2 | 6/2009 | Kinzer et al. | |
| 7,612,602 B2 | 11/2009 | Yang et al. | |
| 7,639,064 B2 | 12/2009 | Hsiao et al. | |
| 7,701,009 B2 | 4/2010 | Koyama | |
| 7,714,360 B2 | 5/2010 | Otsuka et al. | |
| 7,719,055 B1 | 5/2010 | McNutt et al. | |
| 7,745,930 B2 | 6/2010 | Connah et al. | |
| 7,746,020 B2 | 6/2010 | Schnetzka et al. | |
| 7,755,108 B2 | 7/2010 | Kuraguchi | |
| 7,782,099 B2 | 8/2010 | Kawamura | |
| 7,800,215 B2 | 9/2010 | Satou et al. | |
| 7,804,328 B2 | 9/2010 | Pentakota et al. | |
| 7,811,872 B2 | 10/2010 | Hoshi et al. | |
| 7,825,435 B2 | 11/2010 | Machida et al. | |
| 7,851,825 B2 | 12/2010 | Suh et al. | |
| 7,851,909 B2 | 12/2010 | Mishra et al. | |
| 7,852,137 B2 | 12/2010 | Machida et al. | |
| 7,855,401 B2 | 12/2010 | Sheppard et al. | |
| 7,863,877 B2 | 1/2011 | Briere | |
| 7,875,907 B2 | 1/2011 | Honea et al. | |
| 7,875,914 B2 | 1/2011 | Sheppard | |
| 7,884,395 B2 | 2/2011 | Saito | |
| 7,893,676 B2 | 2/2011 | Hanna | |
| 7,893,791 B2 | 2/2011 | Ma et al. | |
| 7,898,004 B2 | 3/2011 | Wu et al. | |
| 7,898,509 B2 | 3/2011 | Iida et al. | |
| 7,902,809 B2 | 3/2011 | Briere et al. | |
| 7,906,837 B2 | 3/2011 | Cabahug et al. | |
| 7,915,643 B2 | 3/2011 | Suh et al. | |
| 7,920,013 B2 | 4/2011 | Sachdev et al. | |
| 7,932,539 B2 | 4/2011 | Chen et al. | |
| 7,965,126 B2 | 6/2011 | Honea et al. | |
| 7,973,335 B2 | 7/2011 | Okamoto et al. | |
| 7,982,242 B2 | 7/2011 | Goto | |
| 8,013,580 B2 | 9/2011 | Cervera et al. | |
| 8,018,056 B2 | 9/2011 | Hauenstein | |
| 8,054,110 B2 | 11/2011 | Wang et al. | |
| 8,063,616 B2 | 11/2011 | Bahramian et al. | |
| 8,084,783 B2 | 12/2011 | Zhang | |
| 8,089,139 B2 | 1/2012 | Shi et al. | |
| 8,111,531 B2 * | 2/2012 | Ilic ...................... | H02M 3/1584 363/132 |
| 8,114,710 B2 | 2/2012 | Muto et al. | |
| 8,188,596 B2 | 5/2012 | Otremba | |
| 8,193,559 B2 | 6/2012 | Haeberlen et al. | |
| 8,193,562 B2 | 6/2012 | Suh et al. | |
| 8,258,622 B2 | 9/2012 | Lee et al. | |
| 8,264,003 B2 | 9/2012 | Herman | |
| 8,289,065 B2 | 10/2012 | Honea et al. | |
| 8,363,437 B2 | 1/2013 | Wang et al. | |
| 8,384,243 B2 | 2/2013 | Adest et al. | |
| 8,441,128 B2 | 5/2013 | Domes | |
| 8,530,904 B2 | 9/2013 | Treu et al. | |
| 8,592,974 B2 | 11/2013 | Wu | |
| 8,633,518 B2 | 1/2014 | Suh et al. | |
| 8,742,460 B2 | 6/2014 | Mishra et al. | |
| 2006/0175627 A1 | 8/2006 | Shiraishi | |
| 2007/0164428 A1 | 7/2007 | Elbanhawy et al. | |
| 2007/0210329 A1 | 9/2007 | Goto | |
| 2008/0017998 A1 | 1/2008 | Pavio | |
| 2008/0231211 A1 | 9/2008 | Baarman et al. | |
| 2008/0248634 A1 | 10/2008 | Beach | |
| 2009/0050936 A1 | 2/2009 | Oka | |
| 2009/0072269 A1 | 3/2009 | Suh et al. | |
| 2009/0085219 A1 | 4/2009 | Bayerer | |
| 2009/0278513 A1 | 11/2009 | Bahramian et al. | |
| 2010/0079192 A1 | 4/2010 | Strzalkowski | |
| 2010/0328833 A1 | 12/2010 | Frisch et al. | |
| 2011/0169549 A1 | 7/2011 | Wu | |
| 2011/0298383 A1 | 12/2011 | Muehlschlegel | |
| 2012/0306464 A1 | 12/2012 | Hirler et al. | |
| 2013/0033240 A1 | 2/2013 | Ye | |
| 2013/0222045 A1 | 8/2013 | Wu | |

FOREIGN PATENT DOCUMENTS

| | | |
|---|---|---|
| CN | 101978589 | 2/2011 |
| CN | 102165694 | 8/2011 |

(56) References Cited

FOREIGN PATENT DOCUMENTS

| | | |
|---|---|---|
| CN | 102308387 | 1/2012 |
| CN | 103477543 | 12/2013 |
| EP | 2 188 842 | 5/2010 |
| EP | 2 243 213 | 10/2010 |
| EP | 2 394 303 | 12/2011 |
| JP | 5-075040 | 3/1993 |
| JP | 6-067744 | 3/1994 |
| JP | 2000-101356 | 4/2000 |
| JP | 2000-124358 | 4/2000 |
| JP | 2003-243612 | 8/2003 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2006-223016 | 8/2006 |
| JP | 2007-036218 | 2/2007 |
| JP | 2007-215331 | 8/2007 |
| JP | 2007-252055 | 9/2007 |
| JP | 2007-294769 | 11/2007 |
| JP | 2008-187167 | 8/2008 |
| JP | 2008-198735 | 8/2008 |
| JP | 2008-199771 | 8/2008 |
| JP | 2009-218475 | 9/2009 |
| JP | 2010-539712 | 12/2010 |
| JP | 2011-512119 | 4/2011 |
| JP | 2012-517699 | 8/2012 |
| KR | 10-1998-0021826 | 6/1998 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2009/036181 | 3/2009 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Authorized officer Simin Baharlou, International Preliminary Report on Patentability in PCT/US2008/076160, dated Mar. 25, 2010, 6 pages.

Authorized officer Jae Woo Wee, International Search Report and Written Opinion in PCT/US2009/033699, dated Sep. 21, 2009, 11 pages.

Authorized officer Dorothée Müllhausen, International Preliminary Report on Patentability in PCT/US2009/033699, dated Aug. 26, 2010, 6 pages.

Authorized officer Sung Hee Kim, International Search Report and the Written Opinion in PCT/US2009/057554, dated May 10, 2010, 13 pages.

Authorized Officer Gijsbertus Beijer, International Preliminary Report on Patentability in PCT/US2009/057554, dated Mar. 29, 2011, 7 pages.

Authorized officer Sung Chan Chung, International Search Report and Written Opinion for PCT/US2010/021824, dated Aug. 23, 2010, 9 pages.

Authorized officer Beate Giffo-Schmitt, International Preliminary Report on Patentability in PCT/US2010/021824, dated Aug. 18, 2011, 6 pages.

Authorized officer Bon Gyoung Goo, International Search Report and Written Opinion in PCT/US2010/055129, dated Jul. 1, 2011, 11 pages.

Authorized officer Yolaine Cussac, International Preliminary Report on Patentability in PCT/US2010/055129, dated May 18, 2012, 6 pages.

Authorized officer Sung Joon Lee, International Search Report and Written Opinion in PCT/US2011/020592, dated Sep. 19, 2011, 9 pages.

Authorized officer Philippe Bécamel, International Preliminary Report on Patentability in PCT/US2011/020592, dated Jul. 19, 2012, 7 pages.

Authorized officer Kee Young Park, International Search Report and Written Opinion in PCT/US2011/023485, dated Sep. 23, 2011, 10 pages.

Authorized officer Nora Lindner, International Preliminary Report on Patentability in PCT/US2011/023485, dated Aug. 16, 2012, 7 pages.

Authorized officer Kwak In Gu, International Search Report and Written Opinion in PCT/US2012/026810, dated Jan. 23, 2013, 10 pages.

Authorized officer Lingfei Bai, International Preliminary Report on Patentability in PCT/US2012/026810, dated Sep. 12, 2013, 6 pages.

Authorized officer Sang Won Choi, International Search Report and Written Opinion in PCT/US2013/027294, dated Jun. 26, 2013, 10 pages.

Authorized officer Kihwan Moon, International Preliminary Report on Patentability in PCT/US2013/027294, dated Sep. 4, 2014, 7 pages.

Authorized officer Sung Gon Kim, International Search Report and Written Opinion in PCT/US2014/032241, dated Aug. 11, 2014, 12 pages.

Authorized officer Athina Nickitas-Etienne, International Preliminary Report on Patentabililty in PCT/US2014/032241, dated Oct. 15, 2015, 9 pages.

Authorized officer Hye Lyun Park, International Search Report and Written Opinion in PCT/US2014/045137, dated Oct. 16, 2014, 9 pages.

Authorized officer Agnès Wittmann-Regis, International Preliminary Report on Patentability in PCT/US2014/045137, dated Jan. 21, 2016, 6 pages.

Search Report and Action in TW Application No. 098132132, dated Dec. 6, 2012, 8 pages.

Search Report and Action in TW Application No. 098141930, dated Jul. 10, 2014, 7 pages.

Chinese Third Office Action in Application No. 200980110230.0, dated Jan. 24, 2014, 18 pages.

Japanese Office Action in Application No. 2010-546867, dated Sep. 24, 2013, 14 pages.

Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.

Choi et al., "AN-9005 Driving and Layout Design for Fast Switching Super-junction MOSFETs," © 2013 Fairchild Corporation, 13 pages.

Huselstein et al., "Use of the MOSFET Channel Reverse Conduction in an Inverter for Suppression of the Integral Diode Recovery Current," 1993, The European Power Electronics Association, pp. 431-436.

Jenkins et al., "The Impact of Parallel GaN HEMTs on Efficiency of a 12-to-1 V Buck Converter," Workshop on Wide Bandgap Power Devices and Applications (WiPDA), 2013 IEEE, pp. 197-200.

Liu et al., Design of a 2 MW DC Supply Using a 4-stage Interleaved DC-DC Converter, in Proc. Energy Conversion Congress and Exposition (ECCE), Sep. 2014 IEEE, pp. 964-970.

Liu et al., "Design and Evaluation of GaN-based Dual-phase Interleaved MHz Critical Mode PFC Converter," In Proc. Energy Conversion Congress and Exposition (ECCE), Sep. 2014 IEEE, pp. 611-616.

Liu et al., "Topology, Cost and Efficiency Comparisons of a 2 MW DC Supply Using Interleaved DC-DC Converter," In Proc. IEEE International Symposium on Power Electronics for Distributed Generation Systems (PEDG), Jun. 2014, 6 pages.

(56) References Cited

OTHER PUBLICATIONS

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Reusch and Strydom, "Improving Performance of High Speed GaN Transistors Operating in Parallel for High Current Applications," PCIM Europe May 20-22, 2014; In Proc. International Exhibition and Conference for Power Electronics, Intelligent Motion, Renewable Energy and Energy Management; pp. 302-309.

Rodríguez et al, "Tutorial on Multilevel Converters," International Conference on Power Electronics and Intelligent Control for Energy Conservation, Warsaw, Poland, Oct. 17-19, 2005, 148 pages.

Silicon Labs, Datasheet of Si823x (2015) [online]; available at www.silabs.com, 57 pages.

Waffler and Kolar, "Efficiency Optimization of an Automotive Multi-phase Bi-directional DC-DC Converter," In Proc. 6th International Power Electronics and Motion Control Conference IPEMC '09, May 17-20, 2009, pp. 566-572.

Wang et al., "Investigation of Driver Circuits for GaN HEMTs in Leaded Packages," Workshop on Wide Bandgap Power Devices and Applications (WiPDA), 2014 IEEE, pp. 81-87.

Wu, "Paralleling High-speed GaN Power HEMTs for Quadrupled Power Output," Applied Power Electronics Conference and Exposition (APEC), 2013, pp. 211-214.

Wu et al., "A 97.8% Efficient GaN HEMT Boost Converter with 300-W Output Power at 1 MHz," Electronic Device Letters, 2008, IEEE, 29(8):824-826.

Wu et al., "High-frequency, GaN Diode-free Motor Drive Inverter with Pure Sine Wave Output," PCIM Europe 2012, Conference Digest, pp. 40-43.

Wu et al., "Total GaN Solution to Electrical Power Conversion," the 69th IEEE Device Research Conference, Conference Digest, Jun. 20-22, 2011, pp. 217-218.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang et al., "Gate Drive Design Considerations for High Voltage Cascode GaN HEMT," Applied Power Electronics Conference and Exposition (APEC), Mar. 2014, pp. 1484-1489.

Zhang et al., "Impact of Interleaving on AC Passive Components of Paralleled Three-phase Voltage-source Converters," IEEE Transactions on Industry Applications, May/Jun. 2010, 46(3): 1042-1054.

Zhou and Wu, "99% Efficiency True-bridgeless Totem-pole PFC Based on GaN HEMTs," PCIM Europe May 14-16, 2013, pp. 1017-1022.

\* cited by examiner

US 10,200,030 B2

PARALLELING OF SWITCHING DEVICES FOR HIGH POWER CIRCUITS

CROSS-REFERENCE TO RELATED APPLICATIONS

This application is a U.S. National Stage of International Application No. PCT/US2016/022214, filed on Mar. 11, 2016, which claims benefit under 35 U.S.C. § 119(e)(1) of U.S. Provisional Application No. 62/133,253, filed on Mar. 13, 2015. The disclosure of the foregoing applications are incorporated by reference herein in their entirety for all purposes.

TECHNICAL FIELD

This specification relates to circuit configurations and methods that allow for operation of high-speed power circuits at very high current and power levels.

BACKGROUND

Using high-speed III-N power switches involves balancing requirements for heat transfer, ease of assembly, and high-speed, low-inductance electrical interconnection. Conventional leaded power packages, such as any of the variations of the TO-220 package 100, which is illustrated in FIG. 1, can be used with III-N power switches. The combination of a metal mounting tab 102 and flexible copper leads 104, 106, and 108 permits attachment of the package to effective heat sinks in a variety of configurations. Connection to a PCB with conventional soldering techniques permits ease of manufacture.

Nonetheless, the package leads typically introduce undesirable inductance. Reduction in switching speed caused by this inductance may be an acceptable design compromise, but instability may still present a problem. Since a power switch can be a high-gain device, if allowed to operate in a linear mode, care should be taken that any oscillations due to parasitic resonances do not couple to a node where positive feedback may sustain or amplify the oscillations.

FIG. 2 is a circuit diagram of a half bridge circuit comprising a gate driver 202, a high side III-N transistor 204 coupled to a high voltage node 206, and a low side III-N transistor 208 coupled to a ground node 210. Two terminals 231 and 233 of the gate driver 202 are coupled to respective gates of the transistors 204 and 208, and two terminals 232 and 234 of the gate driver 202 are coupled to respective sources of the transistors 204 and 208, such that the gate driver is able to apply voltage signals to the gates of each of transistors 204 and 208 relative to their respective sources. An inductor 214 is coupled to the half bridge circuit at an output node 212.

In operation, the gate driver 202 can operate the transistors 204 and 208 in a constant-current mode (CCM), switching rated current at rated voltage. For example, the high voltage node 206 can provide a voltage of 400V or 600V or greater, and the III-N transistors can be configured with a rating to withstand the resulting high currents. Due to the inductance of the inductor 214, current flowing through the inductor 214 cannot change instantaneously.

To illustrate the operation of the half bridge, consider an example scenario where the gate driver 202 turns the high side transistor 204 on and turns the low side transistor 208 off. Current flows from the high voltage node 206, through the high side transistor 204, and through the output node 212 to the inductor 214. When the gate driver 202 turns the high side transistor 204 off, the inductance of inductor 214 drives the voltage at node 212 negative, which allows current to flow up through the low side transistor 208 even though it is off. If the half bridge is implemented using a conventional package, the undesirable inductance introduced by the package leads can cause significant ringing and oscillation related to transient current flowing through the circuit, which can interfere with a stable, efficient switching function.

SUMMARY

In a first aspect, a circuit includes a first half bridge, a second half bridge, a first inductor, a second inductor, and a main inductor. The first half bridge includes a first high side switch, a first low side switch, and a first gate driver, the first gate driver being configured to apply switching signals to the first high side switch and the first low side switch. The second half bridge includes a second high side switch, a second low side switch, and a second gate driver, the second gate driver being configured to apply switching signals to the second high side switch and the second low side switch. The first inductor has a first side electrically connected to an output node of the first half bridge, the output node of the first half bridge being between the first high side switch and the first low side switch. The second inductor has a first side electrically connected to an output node of the second half bridge, the output node of the second half bridge being between the second high side switch and the second low side switch. The main inductor is coupled to a node which is between a second side of the first inductor and a second side of the second inductor. An inductance of the main inductor is greater than an inductance of each of the first and second inductors, and the first and second inductors are inversely coupled to one another.

In a second aspect, a method of operating a circuit configured to provide an output current to a load is described. The method includes applying, by a first gate driver of a first half bridge of the circuit, switching signals to a first high side switch and a first low side switch of the first half bridge, and responsive to the applied switching signals, providing a first output current through an output of the first half bridge; applying, by a second gate driver of a second half bridge of the circuit, switching signals to a second high side switch and a second low side switch of the second half bridge, and responsive to the applied switching signals, providing a second output current through an output of the second half bridge; during a first time period, while providing to the load the output current of the circuit at a first current level, operating both the first and second half bridges to provide the first and second output currents through their respective outputs, such that during the first time period the total output current provided to the load is a sum of the first and second output currents; and during a second time period, while providing to the load the output current of the circuit at a second current level smaller than the first current level, operating the first half bridge to provide the first output current through its output while maintaining the second half bridge in an OFF state, such that during the second time period the total output current provided to the load is equal to the first output current.

The methods and devices described herein may each include one or more of the following. A coupling coefficient of the first and second inductors is in a range of about −0.9 to −1.0. The first and second high side switches are configured to receive common timing signals from a first PWM source, and the first and second low side switches are configured to receive common timing signals from a second PWM source. The first and second half bridges are connected in parallel and are configured to operate as a single half bridge circuit, the single half bridge circuit having a higher maximum output current than either of the first and second half bridges.

The first PWM source is coupled to a first input of the first gate driver and to a first input of the second gate driver, and the second PWM source is coupled to a second input of the first gate driver and to a second input of the second gate driver. The first and second high side switches and the first and second low side switches each comprise two or more switches connected in parallel. The first and second high side switches are both connected to a high voltage node, and the first and second low side switches are both connected to a low voltage or ground node.

The voltage at the high voltage node relative to the low voltage or ground node is about 400V or higher. The first and second gate drivers are configured to apply the switching signals at a frequency between 30 kHz and 10 MHz. The first and second high side switches and the first and second low side switches comprise III-Nitride devices. The III-Nitride devices can be III-Nitride enhancement mode transistors. The III-Nitride devices can be hybrid devices, each hybrid device comprising a depletion mode III-Nitride transistor and an enhancement mode silicon transistor. The main inductor can be part of a load that is driven or controlled by the half bridges of the circuit. The load can comprise an electric motor.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the originally substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications.

As used herein, a "high-voltage device", e.g., a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application.

As used herein, a "III-Nitride" or "III-N device" is a device based on III-N materials. The III-N device can be designed to operate as an enhancement-mode (E-mode) transistor device, such that the threshold voltage of the device (i.e., the minimum voltage that must be applied to the gate relative to the source in order to turn the device on) is positive. Alternatively, the III-N device can be a depletion-mode (D-mode) device, having a negative threshold voltage. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (e.g., the voltage on the gate relative to the source is greater than the device threshold voltage), it is able to conduct substantial current with a low on-voltage. The maximum allowable on-voltage is the maximum voltage that can be sustained in the application in which the device is used.

The details of one or more disclosed implementations of the subject matter described in this specification are set forth in the accompanying drawings and the description below. Other features, aspects, and advantages will become apparent from the description, the drawings and the claims.

DESCRIPTION OF DRAWINGS

Like reference symbols in the various drawings indicate like elements.

DETAILED DESCRIPTION

Many power switching applications require very high output currents, and thus the associated power switching circuits require switches which are capable of conducting large currents with minimal conduction losses and are also capable of switching large voltages with minimal switching losses. In applications in which very high output current levels are needed, one way to achieve the required current levels is to connect multiple switches in parallel and operate the parallel-connected switches as a single switch.

Figure 3:
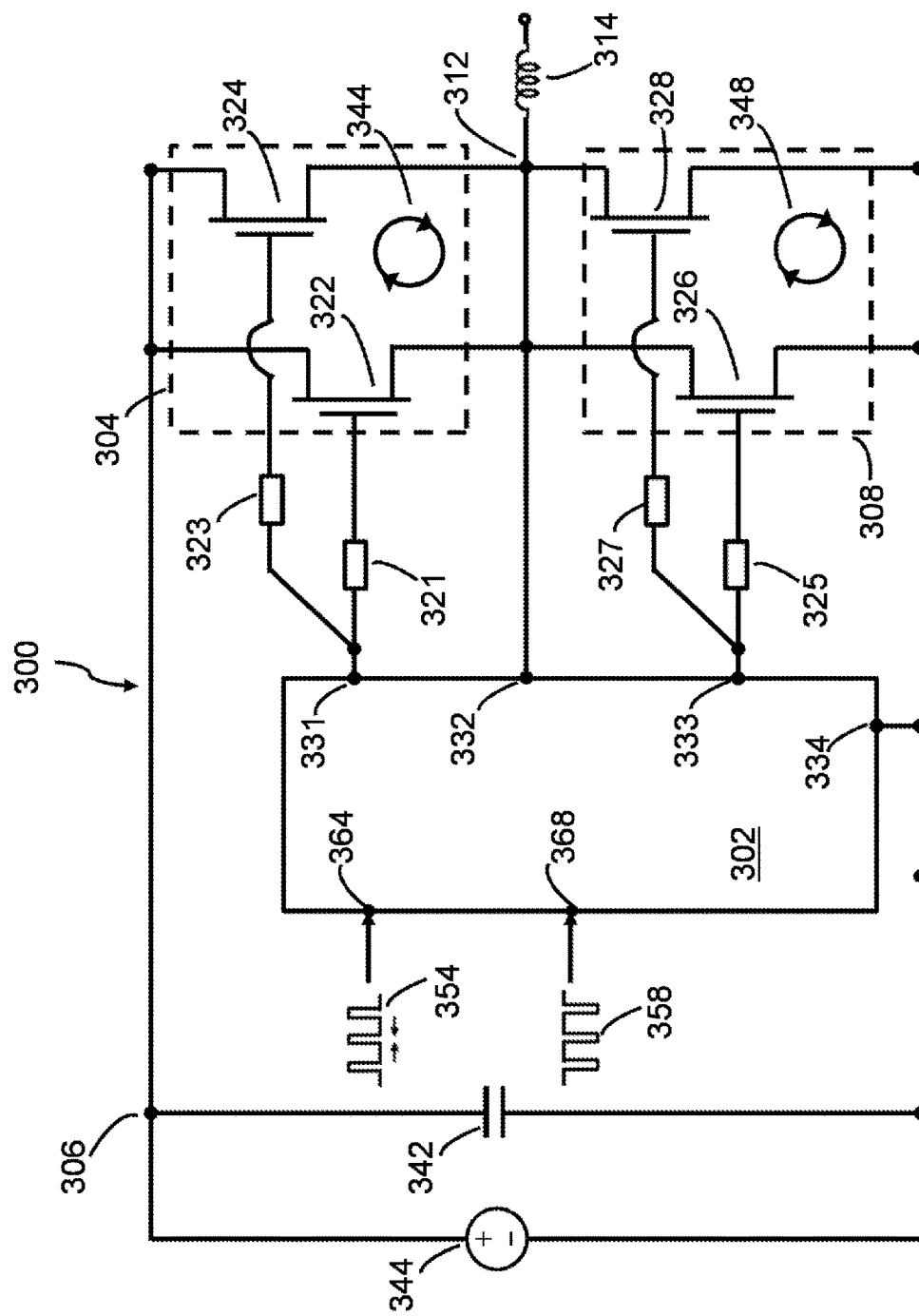
FIG. 3 is a circuit diagram of an example switching circuit in which the high side switch includes two switches connected in parallel, and the low side switch includes two switches connected in parallel.

FIG. 3 is a circuit diagram of an example switching circuit 300, e.g., a half bridge, in which the high side switch 304 includes two switches 322 and 324 connected in parallel, and the low side switch 308 includes two switches 326 and 328 connected in parallel. Output node 331 of the gate driver 302 is coupled to the gates of switches 322 and 324, and thereby switches both of these switches approximately simultaneously. Output node 332 of the gate driver is coupled to the sources of switches 322 and 324, such that voltage signal applied by the gate driver 302 to the gates of switches 322 and 324 is referenced relative to their respective sources. Output node 333 of the gate driver 302 is coupled to the gates of switches 326 and 328, and thereby switches both of these switches approximately simultaneously. Output node 334 of the gate driver is coupled to the sources of switches 326 and 328, such that voltage signal applied by the gate driver 302 to the gates of switches 326 and 328 is referenced relative to their respective sources.

Output node 331 can be directly connected to the gates of switches 322 and 324 (not shown), or alternatively a resistive component 321 can be coupled between output node 331 and the gate of switch 322, and resistive component 323 can be coupled between output node 331 and the gate of switch 324. Output node 333 can be directly connected to the gates of switches 326 and 328 (not shown), or alternatively a resistive component 325 can be coupled between output node 333 and the gate of switch 326 and resistive component 327 can be coupled between output node 333 and the gate of switch 328. Resistive components 321, 323, 325, and 327 can, for example, be resistors or ferrite beads, which may help improve circuit stability.

A first pulse-width modulated (PWM) source 354 connected to a first input 364 of the gate driver 302 provides the timing for the on/off signals applied at output node 331, and a second PWM source 358 connected to a second input 368 of the gate driver 302 provides the timing for the on/off signals applied at output node 333. Inductor 314 is coupled (e.g., electrically connected) to the circuit at output node 312. The entire circuit can be formed on a circuit board with printed wiring connections that electrically couple the components of the circuit.

Figure 4:
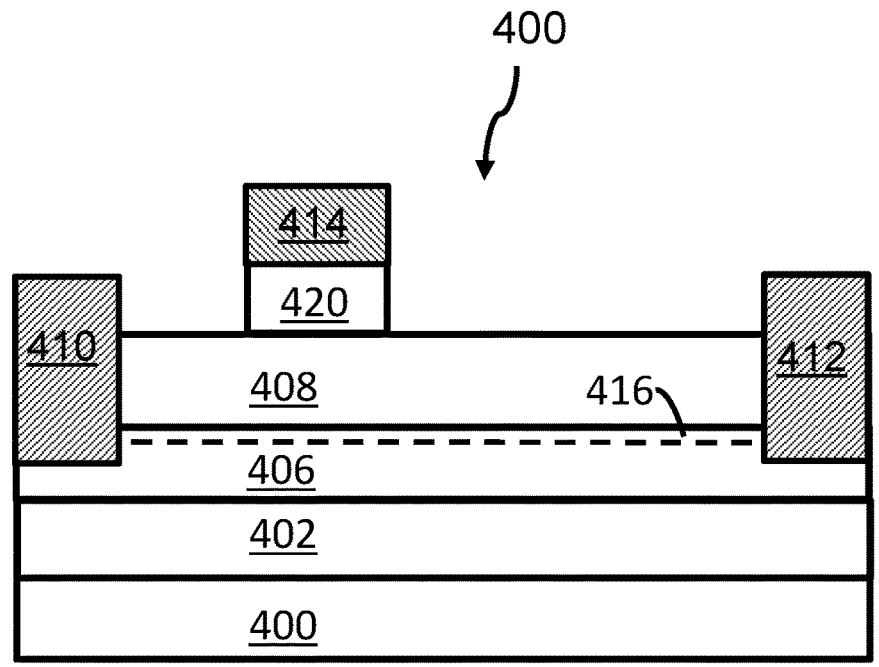
FIG. 4 is a cross-sectional view of a transistor as an example III-Nitride transistor.

Switches 322, 324, 326, and 328 are capable of being operated at higher switching frequencies than some switches used in conventional high-voltage power switching circuits, such as switches implemented as silicon-based transistors (e.g., silicon-based MOSFETs or IGBTs). For example, switches 322, 324, 326, and 328 can be III-N transistors, such as the III-N transistor shown in FIG. 4, which may be capable of being switched at higher frequencies than silicon-based MOSFETs or IGBTs without exhibiting substantial additional power loss or other instabilities during operation. As seen in FIG. 4, a III-Nitride high electron mobility transistor (HEMT) can include a substrate 400 (e.g., a silicon substrate), a III-N buffer layer 402 formed of a III-N semiconductor material such as AlN or AlGaN, a III-N channel layer 406 formed of a III-N semiconductor material such as GaN, a III-N barrier layer 408 formed of a III-N semiconductor material (e.g., AlGaN or AlN) having a larger bandgap than that of the III-N channel layer 406, and a two-dimensional electron gas (2DEG) channel 416 formed in the III-N channel layer 406 adjacent to the III-N barrier layer 408, the 2DEG channel 416 serving as the conductive channel of the transistor. The III-N HEMT further includes source and drain contacts 410 and 412, respectively, which contact the 2DEG channel 416. A gate electrode 414, which is deposited between the source and drain contacts 410 and 412, respectively, is used to modulate the conductivity of the channel in the region directly below the gate electrode 414. Optionally, a gate insulator 420 is included between the gate electrode 414 and the underlying III-N semiconductor materials.

Referring back to FIG. 3, in many applications, it is preferable that switches 304 and 308 be provided as enhancement-mode devices, thereby requiring that switches 322, 324, 326, and 328 each be provided as enhancement-mode devices. However, switching devices formed of single high-voltage enhancement-mode transistors can be difficult to fabricate reliably. For example, due at least partially to tight process tolerances, it can be difficult to design a III-N HEMT such as the device shown in FIG. 4 such that it consistently and reliably operates as an enhancement-mode device with a positive threshold voltage. That is, even when a design is implemented for a III-N HEMT for which the resulting HEMT should be an enhancement-mode device, small variations in layer thicknesses, feature dimensions, etc., that typically occur can result in many of the devices either being depletion-mode devices or otherwise not exhibiting a high enough threshold voltage for reliable operation.

Figure 5:
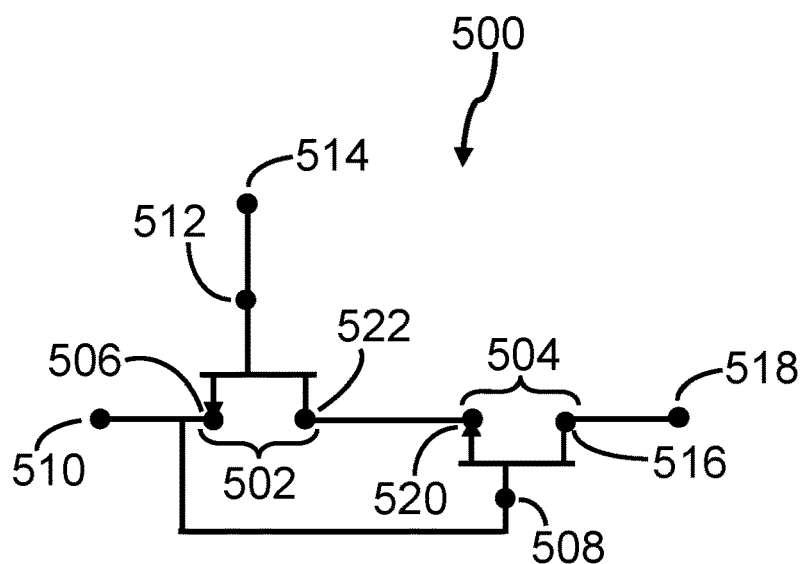
FIG. 5 is a circuit schematic illustrating a hybrid device that includes a high-voltage depletion-mode transistor and a low-voltage enhancement-mode transistor.

As an alternative to a single high-voltage enhancement-mode transistor, when enhancement-mode switches which can be operated at high switching frequencies are desired for switches 322, 324, 326, and 328, the switches can each be implemented as a hybrid device that includes a high-voltage depletion-mode (D-mode) transistor 504 and a low-voltage enhancement-mode (E-mode) transistor 502, configured as shown in FIG. 5. The resulting hybrid device of FIG. 5 can be operated in the same way as a single high-voltage E-mode transistor, and in many cases achieves the same or similar output characteristics as a single high-voltage E-mode transistor. The source electrode 506 of the low-voltage E-mode transistor 502 and the gate electrode 508 of the high-voltage D-mode transistor 504 are both electrically connected together, for example with wire bonds, and together form the source 510 of the hybrid device. The gate electrode 512 of the low-voltage E-mode transistor 502 forms the gate 514 of the hybrid device. The drain electrode 516 of the high-voltage D-mode transistor 504 forms the drain 518 of the hybrid device. The source electrode 520 of the high-voltage D-mode transistor 504 is electrically connected to the drain electrode 522 of the low-voltage E-mode transistor 502.

In particular implementations of the hybrid device of FIG. 5, the hybrid device is implemented as a III-N device. In this case, the D-mode transistor 504 is a high-voltage III-N D-mode transistor (e.g., capable of blocking at least 200V while biased in the OFF state), and the E-mode transistor 502 is a low-voltage silicon-based E-mode transistor (e.g., cannot reliably block voltages greater than 100V while biased in the OFF state). Although such an implementation of a III-N switch utilizes a silicon-based transistor in the switch, because the silicon-based transistor is a low-voltage device, the switch can still be capable of being operated at the higher switching frequencies.

Referring back to FIG. 3, due to the use of III-N transistors (as in FIG. 4) or hybrid devices (as in FIG. 5), e.g., III-N hybrid devices, for switches 322, 324, 326, and 328, the switching circuit 300 illustrated in FIG. 3 can be operated at higher switching frequencies than some conventional switching circuits implemented using silicon transistors. For example, the switching circuit 300 can be operated at a switching frequency of 30 kHz or higher, 50 kHz or higher, 80 kHz or higher, or up to 1 MHz or higher (i.e., during operation of the circuit, the switches can be switches at a frequency of 30 kHz or higher, 50 kHz or higher, 80 kHz or higher, or up to 1 MHz or higher). The high switching frequencies that can be utilized result at least partially because the switches 322, 324, 326, and 328 can be switched at much higher switching speeds or slew rates than conventional switches. For example, when switches 322, 324, 326, and 328 are switched on or off, the rate of change of voltage across the switches (typically referred to as the voltage switching rate or just the switching rate) can be greater than 40 Volts/nanosecond, e.g. in the range of 50-200 Volts/nanosecond, and the rate of change of current (typically referred to as the current switching rate) can be greater than 2 Amps/nanosecond, e.g. in the range of 3-10 Amps/nanosecond.

Figure 1:
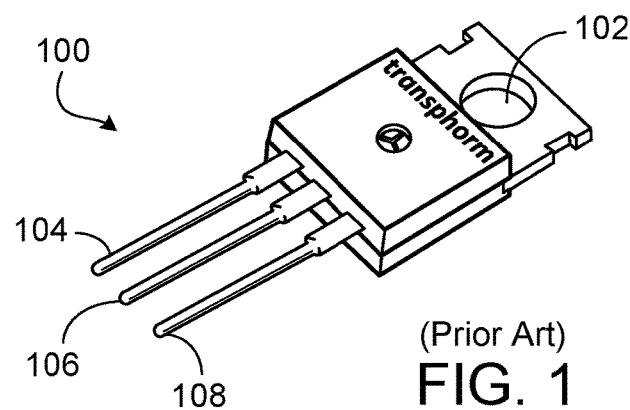
FIG. 1 is an illustration of a leaded power package.

In the circuit 300 of FIG. 3, when the switches 322, 324, 326, and 328 are each encased in an individual package, such as the package shown in FIG. 1, and are switched at high frequencies and/or high switching rates, parasitic inductances introduced by the package leads along with intrinsic delays in each of the switches can lead to circuit instability. For example, although the gates of switches 322 and 324 are both electrically connected (or electrically coupled) to the same output node 331 of the gate driver 302, parasitics and delays in the switches typically cause one of the switches to be switched a short time before the other (the same also being true for switches 326 and 328). This can cause current from one of switching devices 322 or 324 to be coupled into the other switch rather than into inductor 314 immediately after switching, as indicated by the circulating current lines 344 and 348 shown in FIG. 3. This may lead to voltage overshoots and oscillations as well as circuit instability in the circuit 300, and typically results in circuit failure. Hence, although the configuration of FIG. 3 allows for much larger output currents through inductor 314 than in a bridge circuit in which each switch 304 and 308 is formed of a single switch (rather than multiple switches connected in parallel), it can be very difficult to achieve stable circuit operation in the circuit 300 of FIG. 3. Furthermore, although additional switches may be added in parallel with each of the parallel-connected switches in order to further increase the current output capabilities of the circuit, doing so further increases circuit parasitics and thereby further increases the voltage oscillations and instabilities in the circuit.

Figure 6:
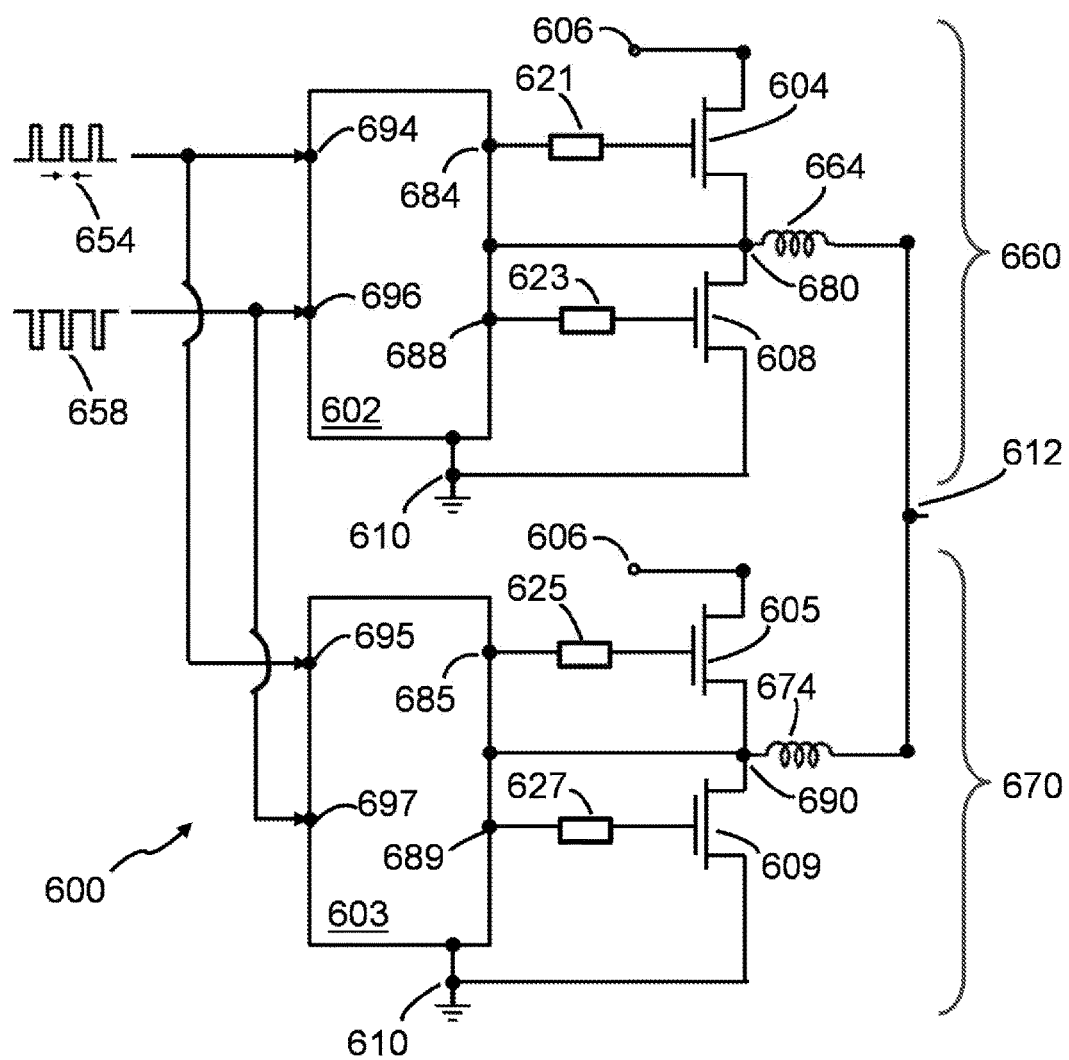
FIG. 6 is a circuit diagram of an example switching circuit, in which two half bridge circuits are connected in parallel to operate as a single half bridge circuit.

FIG. 6 is a circuit diagram of an example switching circuit 600 in which two half bridge circuits 660 and 670 are connected in parallel to operate as a single half bridge circuit with a maximum output current that can be as high as two times the maximum output current of each of the individual half bridge circuits 660 and 670. Each of the half bridge circuits 660 and 670 has an inductor 664 and 674 at its respective output, with output ends of inductors 664 and 674 each connected to the output 612 of the circuit 600. The switches of half bridge circuit 660 are each driven by a first gate driver 602, and the switches of half bridge circuit 670 are each driven by a second gate driver 603. The outputs 684 and 685 of the gate drivers 602 and 603 which send control signals to the gates of high side switches 604 (in half bridge circuit 660) and 605 (in half bridge circuit 670) each receive their timing signals from a first common PWM source 654 which is connected to a first input 694 of the first gate driver 602 and to a first input 695 of the second gate driver 603. The outputs 688 and 689 of the gate drivers 602 and 603 which send control signals to the gates of low side switches 608 (in half bridge circuit 660) and 609 (in half bridge circuit 670) each receive their timing signals from a second common PWM source 658 which is connected to a second input 696 of the first gate driver 602 and to a second input 697 of the second gate driver 603.

In the circuit 600 of FIG. 6, switches 604 and 605 are switched approximately simultaneously, and switches 608 and 609 are switched approximately simultaneously. Hence, half bridges 660 and 670 output approximately the same current at all times (other than short times before and after switching due to parasitics/delays, as previously described), and so the total maximum output current of circuit 600 can be as much as about two times that of each of half bridges 660 and 670. However, the currents output by each of switches 604 and 605 are decoupled from one another by inductors 664 and 674, as are the currents output by each of switches 608 and 609 (the total inductance between nodes 680 and 690 is the sum of the inductances of inductors 664 and 674). As such, even if there exists a relative delay between the switching of the high side switches 604 and 605 or between the switching of the low side switches 608 and 609, the increased voltage oscillations and instabilities that were described with respect to the circuit of FIG. 3 are not present or are substantially mitigated in circuit 600. Thus, circuit 600 is capable of providing much higher output current than a conventional half bridge circuit while still allowing for reliable, stable circuit operation.

Figure 2:
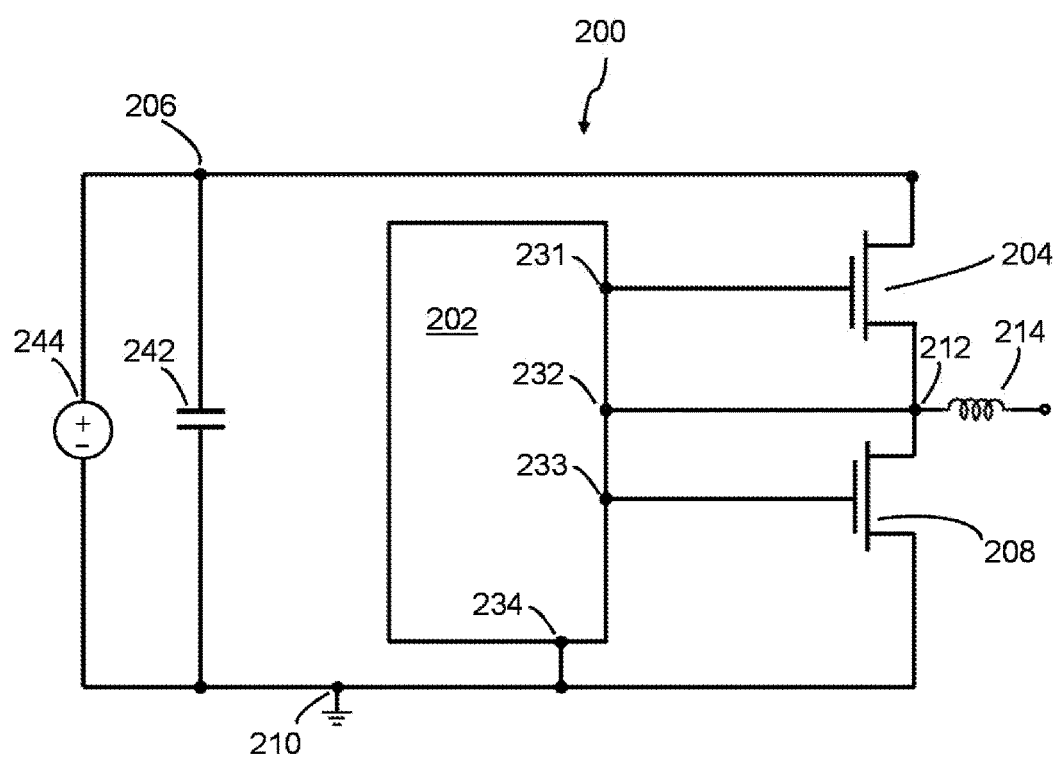
FIG. 2 is a circuit diagram of a half bridge circuit comprising a gate driver, a high side III-N transistor coupled to a high voltage node, and a low side III-N transistor coupled to a ground node.

While the configuration of circuit 600 allows for a stable operation of a power switching circuit with very high current capabilities, it requires two output inductors 664 and 674, as compared to a single inductor 214/314 in the circuits of FIGS. 2 and 3. Inductors 214, 314, 664, and 674 are quite large, for example in the range of about 20-200 μH or larger. Including two such inductors can substantially increase the size and cost of the circuit.

Figure 7:
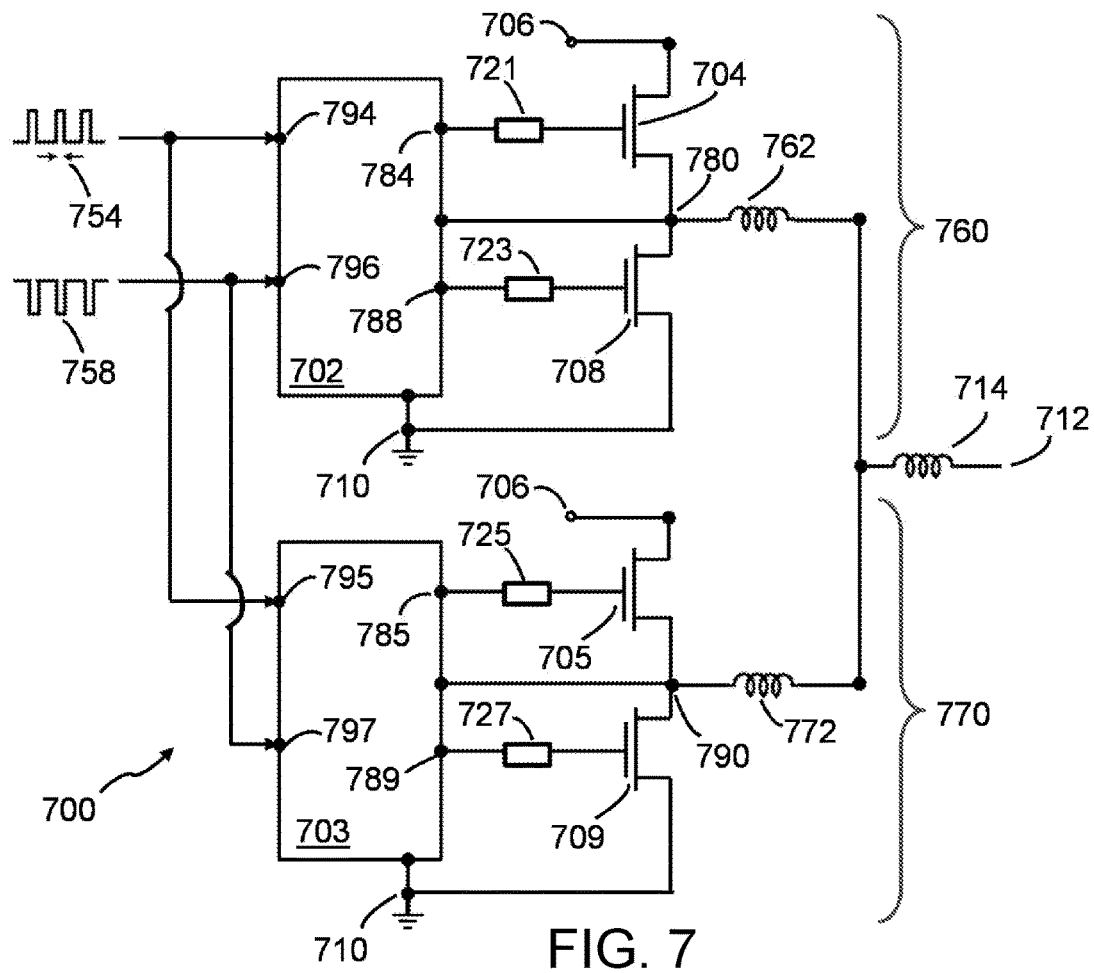
FIG. 7 is a schematic diagram of a circuit which includes a single large output inductor and a pair of smaller inversely coupled inductors.

FIG. 7 is a schematic diagram of a circuit 700 which is similar to that of FIG. 6, except that the large output inductors 664 and 674 are replaced by a single large main output inductor 714 and a pair of smaller inversely coupled inductors 762 and 772, connected as shown. The main output inductor 714 has a substantially larger inductance than each of the inversely coupled inductors 762 and 772. For example, the inductance of main output inductor 714 can be at least two times, at least three times, at least five times, or at least ten times that of each of the inversely coupled inductors 762 and 772.

Similar to circuit 600 in FIG. 6, circuit 700 in FIG. 7 is capable of providing much higher output current than a conventional half bridge circuit while still allowing for reliable, stable circuit operation. However, circuit 700 has the added benefit of having one of the two large output inductors in the circuit of FIG. 6 replaced by a pair of substantially smaller inductors, thereby reducing the size and cost of the entire circuit.

Inductors 762 and 772 have approximately the same self inductance (e.g., the self inductance of inductor 762 can be within 2%, 5%, or 10% of that of inductor 772) and are configured to be inversely coupled to one another, such that their coupling coefficient k is equal or close to −1, for example in the range of −0.9 to −1.0. As such, during circuit operation, the total inductance $L_{loop}$ between nodes 780 and 790 (self inductance of each of inductors 762 and 772, plus their respective mutual inductances) is approximately equal to four times the self inductance of each of inductors 762 and 772. Simulations have shown that in many applications, inductors 762 and 772 can each have a self inductance that is less than 20% or less than 10% of that of main output inductor 714 and still substantially limit current flowing between nodes 780 and 790 during circuit operation.

Figure 8:
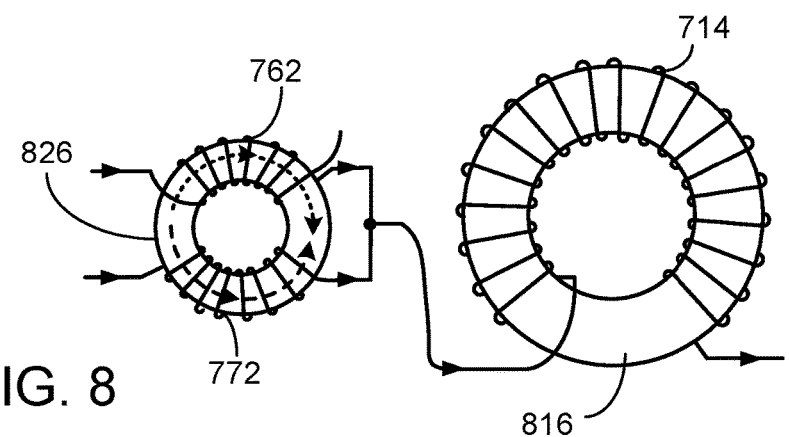
FIG. 8 is an illustration of a configuration for the inductors of FIG. 7.

FIG. 8 illustrates a possible configuration for inductors 762, 772, and 714. The main output inductor 714 is formed of a wire coiled around a first ferromagnetic core 816. The inversely coupled inductors 762 and 772 are formed of a pair of wires wrapped in opposite directions around a second ferromagnetic core 826. Because inductors 762 and 772 each have much smaller self inductance than that of inductor 714, the second ferromagnetic core 826 may be smaller than the first ferromagnetic core 816. As seen in FIG. 8, the ferromagnetic cores 816 and 826 may be toroid cores.

Figure 9:
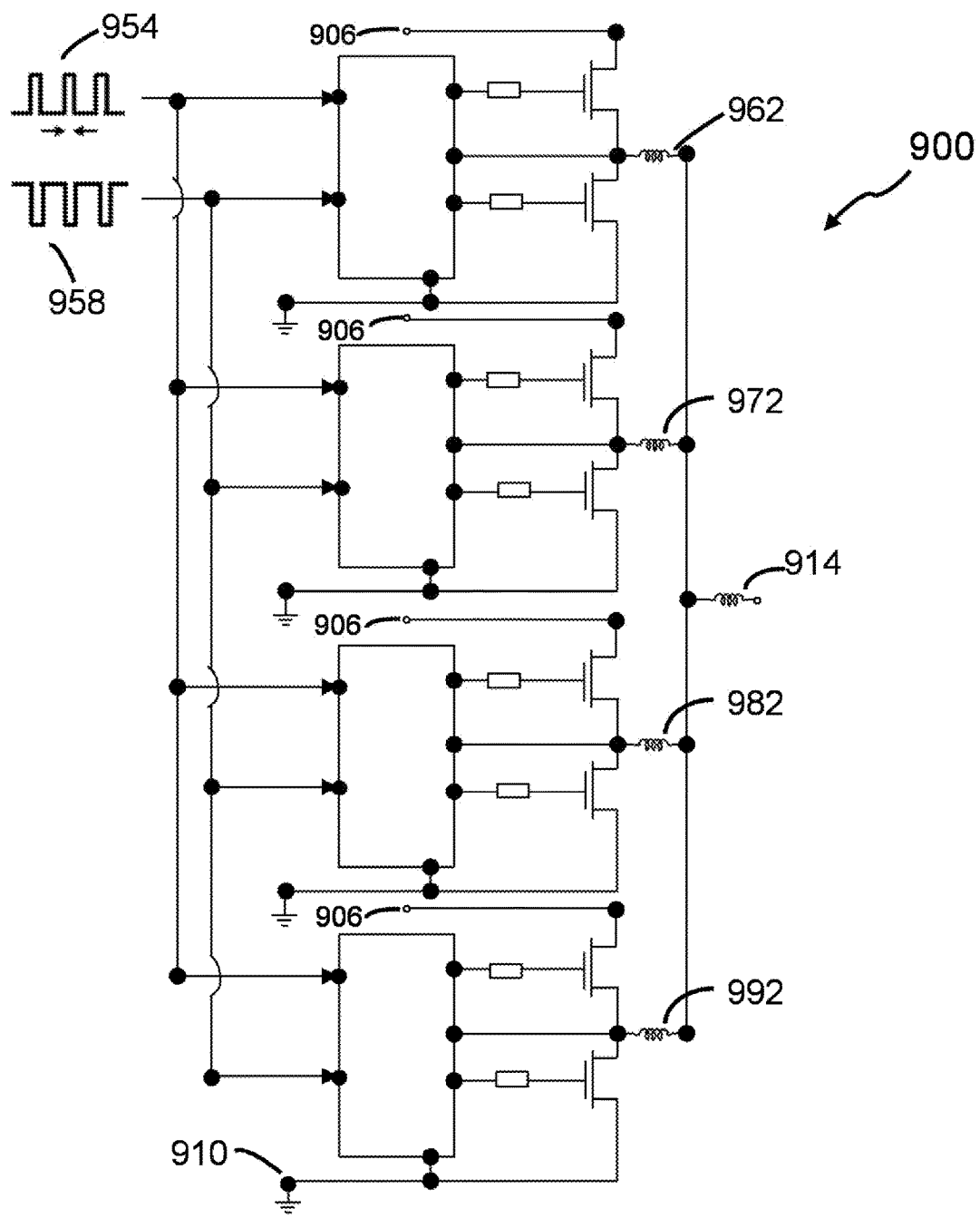
FIG. 9 is a circuit diagram of an example circuit, in which four half bridge circuits are combined to operate as a single half bridge.

FIG. 9, which is a schematic diagram of a circuit 900, illustrates how 2×N half bridges, where N is an integer, can be combined to operate as a single half bridge with an even larger maximum output current. FIG. 9 illustrates the case where N=2, such that the outputs of 4 half bridge circuits are combined. The entire circuit 900 includes a single large main output inductor 914. Each of the 4 half bridges includes a smaller inductor 962/972/982/992 at their respective outputs. Inductors 962, 972, 982, and 992 are each inversely coupled to one another, such that their respective coupling coefficients are close to −1 (e.g., in the range of −0.9 to −1.0). As with the circuit 700 of FIG. 7, circuit 900 in FIG. 9 is capable of providing much higher output current than a conventional half bridge circuit while still allowing for reliable, stable circuit operation.

Figure 10:
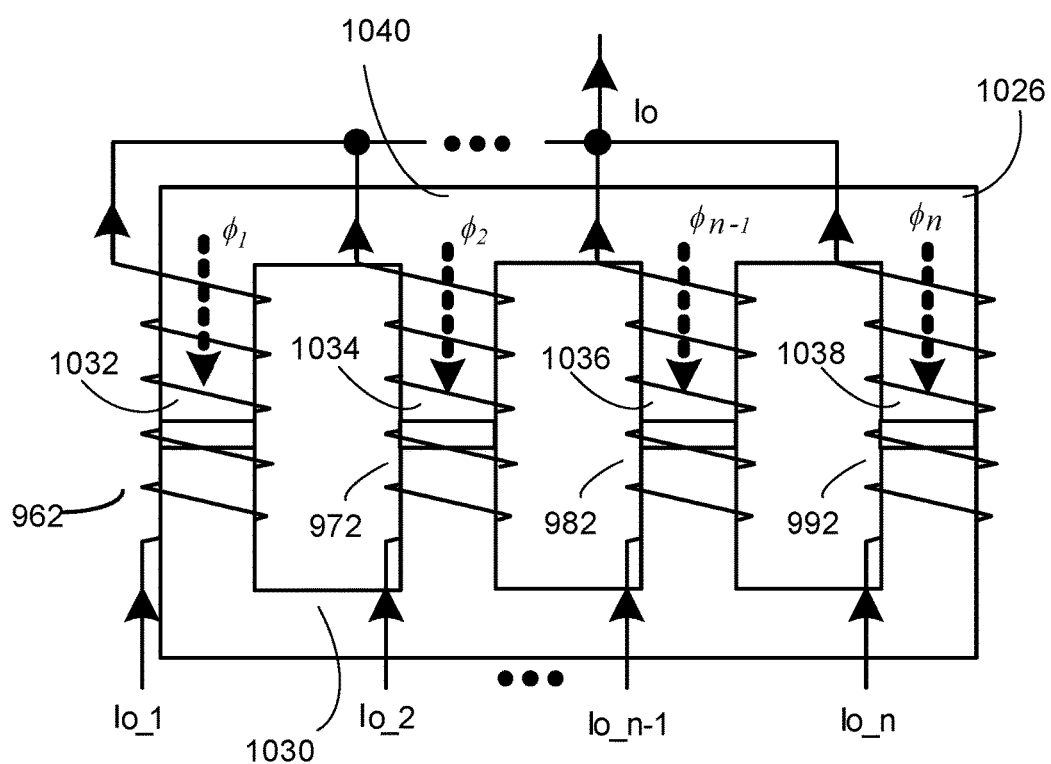
FIG. 10 is an illustration of a configuration for the inversely coupled inductors in the circuit of FIG. 9.

FIG. 10 illustrates a possible configuration for the inversely coupled inductors 962, 972, 982, and 992 of FIG. 9. The inductors 962, 972, 982, and 992 are all formed from a single ferromagnetic core 1026. Core 1026 includes a first end portion 1030, a second end portion 1040, and 2×N segments 1032, 1034, 1036, and 1038 extending from the first end portion 1030 to the second end portion 1040. Inductor 962 is formed by coiling a first wire around the first segment 1032, inductor 972 is formed by coiling a second wire around the second segment 1034, inductor 982 is formed by coiling a third wire around the third segment 1036, and inductor 992 is formed by coiling a fourth wire around the fourth segment 1038.

Figure 11:
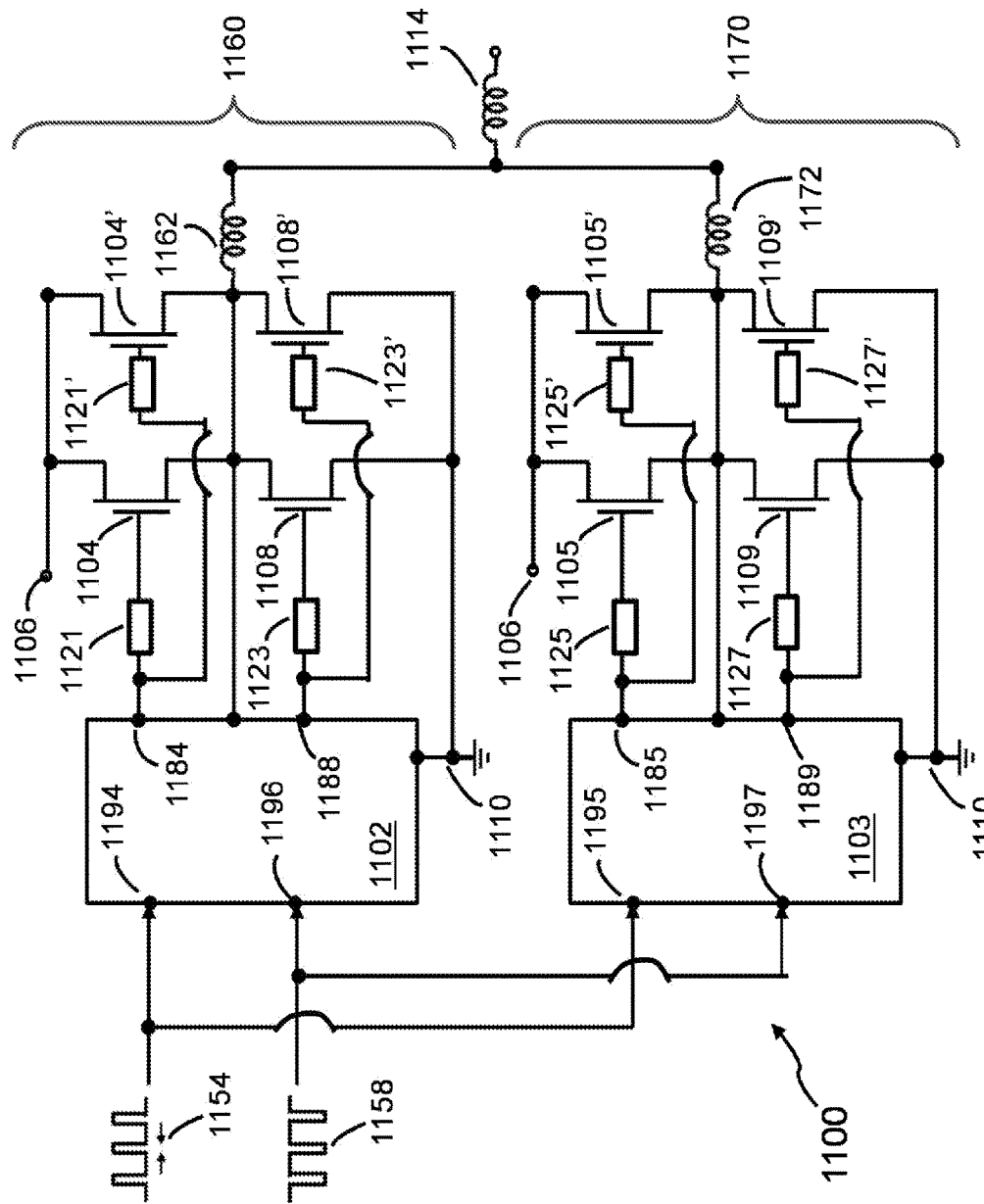
FIG. 11 is a schematic diagram of another circuit which can be operated as a single half bridge.

FIG. 11 is a schematic diagram of a circuit 1100 in which features of the circuits of FIGS. 3 and 7 are combined into a single circuit. As in FIG. 7, the circuit 1100 includes a pair of half bridges 1160 and 1170, connected in parallel to operate as a single half bridge circuit with a maximum output current that can be as high as two times the maximum output current of each of the individual half bridge circuits 1160 and 1170. The switches of the half bridges are each formed by paralleling two switches in order to increase the maximum output current of each switch, as in FIG. 3. The entire circuit 1100 includes a single large main output inductor 1114, and each half bridge 1160 and 1170 includes a smaller inductor 1162 and 1172 at its respective output, where inductors 1162 and 1172 are inversely coupled to one another.

A method for operating the circuits of FIGS. 6, 7, and 11 which can further improve their efficiencies is as follows. During times where the output currents of the circuits are large, the half bridges operate in parallel, as previously described. During these high current time periods, losses are dominated by conduction loss through the switches, and so simultaneously operating two half bridges in parallel minimizes these losses. However, during times where the output currents of the circuits are small, conduction losses are small, and the total circuit loss is dominated by switching losses. During these low current time periods, one of the half bridges is turned off while the other is still operated. While this may slightly increase conduction losses during the low current time periods, switching losses, which are the dominant loss mechanisms during the low current time periods, are reduced by approximately a factor of two.

Similar methods can be applied to the circuit of FIG. 9. For example, all 4 half bridges can be operated during time periods of very high current, 3 half bridges can be operated during periods of slightly lower current, 2 half bridges can be operated during times of even lower output current, and 1 half bridge can be operated during times when the output current is very low.

Figure 12:
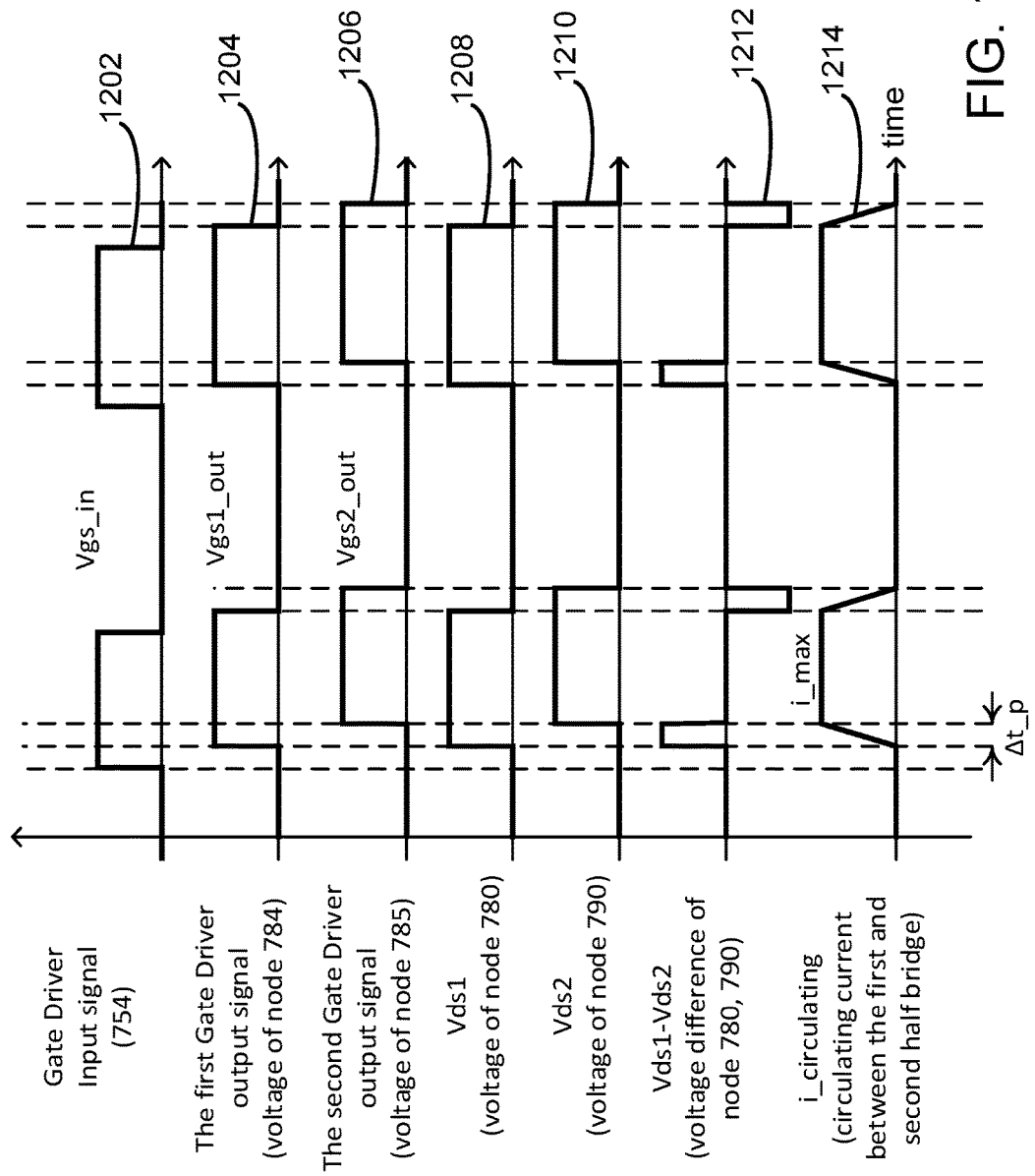
FIG. 12 shows waveforms of voltages and currents from the disclosed circuits.

FIG. 12 shows examples of the input and output voltage waveforms associated with the operation of the circuit 700 shown in FIG. 7. The horizontal axis is time, the vertical access is voltage, and the various voltages plotted in FIG. 12 are each superimposed over one another and vertically offset with respect to each other. The gate driver input signal 754 (represented by waveform 1202 in FIG. 12) is applied to the first half bridge gate driver 702 at input node 794 and to the second half bridge gate driver 703 at input node 795. There exists a first delay between application at the first gate driver 702 of an input voltage signal 754 (waveform 1202) and issuance by the first gate driver at node 784 of a first gate driver output signal (waveform 1204). There also exists a second delay between application at the second gate driver 703 of the input voltage signal 754 (waveform 1202) and issuance by the second gate driver at node 785 of a second gate driver output signal (waveform 1206). The first delay may be different than the second delay, where the difference is represented in FIG. 12 by $\Delta t_p$. Hence, the output signal timing of the first gate driver 702 at node 784 can be slightly different than the output signal timing of the second gate driver at node 785. Waveforms 1208 and 1210 represent the resulting output voltages at output nodes 780 and 790, respectively, as a function of time, and the difference between these output voltages as a function of time is represented by waveform 1212. The difference (represented by waveform 1212) between the voltage Vds1 at the output node 780 of the first half bridge circuit 760 and the voltage Vds2 at the output node 790 of the second half bridge circuit 770 due to the $\Delta t_p$ can cause a circulating current between output 780 of the first half bridge circuit and output 790 of the second half bridge circuit, where the relative magnitude of the circulating current as a function of time is given by waveform 1214. The small inductors 762 and 772 act to limit this circulating current. The magnitude of the circulating current is given by $i_{circulating} = V_{dc} * \Delta t_p$ where $L_{loop}$ is described previously, and $V_{dc}$ is the input voltage at node 706. For a typical circuit operation of $400V_{dc}$, with $\Delta t_p$ being less than 10 ns, the circulating current is limited to less than 1 A. For this configuration, the total inductance of the inversely coupled inductors 762 and 772 can be about 4 μH. The large inductor 714 acts to control the output current ripple. Typically, the current ripple is 20% to 30% of the rated output current.

Figure 13:
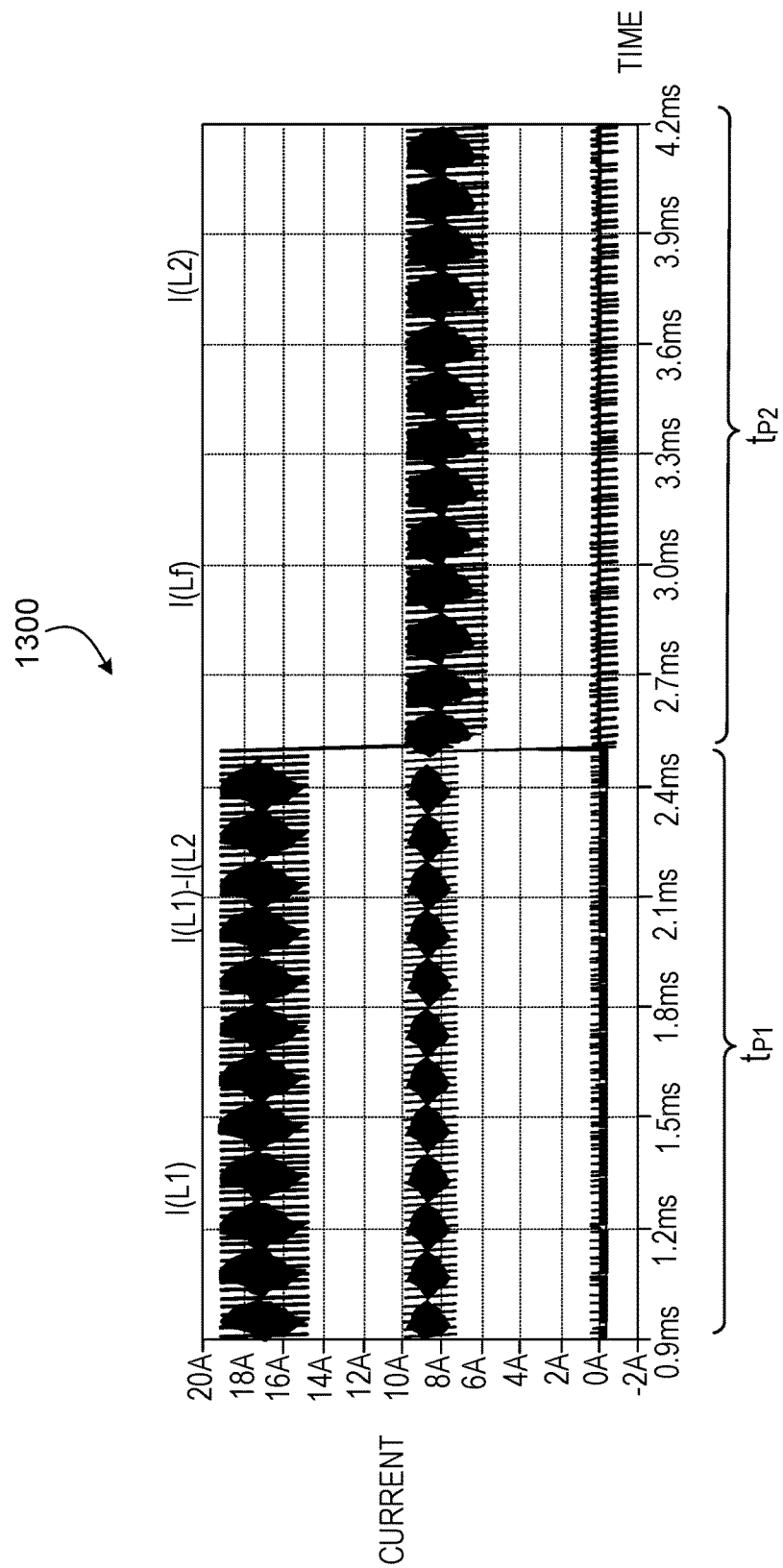
FIG. 13 shows waveforms of currents when the disclosed circuits are operated in a particular manner.

FIG. 13 shows a plot 1300 of output waveforms during operation of the circuits in FIGS. 6, 7, and 11 described above. Waveform $I(L_1)$ shows time dependence of a first output current through the first small inductor 664, 762 or 1162. Waveform $I(L_2)$ shows time dependence of a second output current through the second small inductor 674, 772 or 1172. Waveform $I(L_1)-I(L_2)$ shows time dependence of a difference between the first and second output currents. Waveform $I(L_f)$ shows time dependence of an output current at the node 612 or an output current through the large inductor 714 or 1114.

In general, each of the first and second half bridge circuits of the circuits in FIGS. 6, 7, and 11 can be in either an ON state or an OFF state. In the example illustrated in FIG. 13, during a first time period $t_{P1}$ (before 2.5 ms), both the first and second half bridge circuits are operating (i.e., are being maintained in their respective ON states) to share the total output current having a first current level (e.g., of 17 amps). The small inductors help to balance the current and keep the circulating current small. At 2.5 ms the output current drops to second current level (e.g., of 8.5 amps). In response to the foregoing drop in output current, the second half bridge is turned off (and, thus, the second half bridge transitions from its ON state to its OFF state). As such, during a second time period $t_{P2}$ (after 2.5 ms), only the first half bridge is operated, and the second half bridge is maintained in its OFF state. Since the current during the second time period is small compared to the current during the first time period, the switching loss becomes dominant. To minimize switching losses, the second half bridge is kept off, and the total current is output by the first half bridge. There remains a small current charging and discharging the output capacitance of the GaN HEMTs of the second half bridge. However, since the second half bridge remains off, this will not result in switching losses in the second half bridge. Thus, the method of operating the circuit as described above improves the efficiency of the circuits in FIGS. 6, 7, and 11 during low power conditions.

A number of implementations have been described. Nevertheless, it will be understood that various modifications may be made without departing from the spirit and scope of the techniques and devices described herein. For example, in each of the circuits described herein, when the circuit is connected to and used to control or drive a load which has a large inductance, for example when the load is an electric motor, a separate main output inductor (such as inductors 314, 664, 674, 714, 914, and 1114) may not be needed. Instead, the load inductance functions as the output inductance of the circuit. Additionally, the switches of any of the circuits described herein can be formed of III-Nitride devices, and can be switched at high frequencies and/or high current and voltage switching rates, similar to switches 322, 324, 326, and 328 of FIG. 3. That is, the same devices used for switches 322, 324, 326, and 328 in FIG. 3 can be used for the switches of any of the other circuits described herein. Furthermore, circuit nodes referred to as "output nodes" may also be input nodes for the circuit. For example, when the circuit is used in applications where the output current is bidirectional, the output node will function as both an input node and an output node during operation of the circuit. Accordingly, other implementations are within the scope of the following claims.

What is claimed is:

1. A circuit comprising:
   a first half bridge comprising a first high side switch, a first low side switch, and a first gate driver, the first gate driver being configured to apply switching signals to the first high side switch and the first low side switch;
   a second half bridge comprising a second high side switch, a second low side switch, and a second gate driver, the second gate driver being configured to apply switching signals to the second high side switch and the second low side switch;
   a first inductor having a first side electrically connected to an output node of the first half bridge, the output node of the first half bridge being between the first high side switch and the first low side switch;
   a second inductor having a first side electrically connected to an output node of the second half bridge, the output node of the second half bridge being between the second high side switch and the second low side switch; and
   a main inductor coupled to a node which is between a second side of the first inductor and a second side of the second inductor; wherein
   an inductance of the main inductor is greater than an inductance of each of the first and second inductors; and
   the first and second inductors are inversely coupled to one another.

2. The circuit of claim 1, wherein a coupling coefficient of the first and second inductors is in a range of −0.9 to −1.0.

3. The circuit of claim 1, wherein the first and second high side switches are configured to receive common timing signals from a first PWM source, and the first and second low side switches are configured to receive common timing signals from a second PWM source.

4. The circuit of claim 3, wherein the first and second half bridges are connected in parallel and are configured to operate as a single half bridge circuit, the single half bridge circuit having a higher maximum output current than either of the first and second half bridges.

5. The circuit of claim 3, wherein the first PWM source is coupled to a first input of the first gate driver and to a first input of the second gate driver, and the second PWM source is coupled to a second input of the first gate driver and to a second input of the second gate driver.

6. The circuit of claim 1, wherein the first and second high side switches and the first and second low side switches each comprise two or more switches connected in parallel.

7. The circuit of claim 1, wherein the first and second high side switches are both connected to a high voltage node, and the first and second low side switches are both connected to a low voltage or ground node.

8. The circuit of claim 7, wherein the voltage at the high voltage node relative to the low voltage or ground node is about 400V or higher.

9. The circuit of claim 8, wherein the first and second gate drivers are configured to apply the switching signals at a frequency between 30 kHz and 10 MHz.

10. The circuit of claim 1, wherein the first and second high side switches and the first and second low side switches comprise III-Nitride devices.

11. The circuit of claim 10, wherein the III-Nitride devices are III-Nitride enhancement mode transistors.

12. The circuit of claim 10, wherein the III-Nitride devices are hybrid devices, each hybrid device comprising a depletion mode III-Nitride transistor and an enhancement mode silicon transistor.

13. The circuit of claim 1, wherein the main inductor is part of a load that is driven or controlled by the half bridges of the circuit.

14. The circuit of claim 13, wherein the load comprises an electric motor.

15. A method of operating a circuit configured to provide an output current to a load, the method comprising:
- applying, by a first gate driver of a first half bridge of the circuit, switching signals to a first high side switch and a first low side switch of the first half bridge, and responsive to the applied switching signals, providing a first output current through an output of the first half bridge;
- applying, by a second gate driver of a second half bridge of the circuit, switching signals to a second high side switch and a second low side switch of the second half bridge, and responsive to the applied switching signals, providing a second output current through an output of the second half bridge;
- during a first time period, while providing to the load the output current of the circuit at a first current level, operating both the first and second half bridges to provide the first and second output currents through their respective outputs, such that during the first time period the total output current provided to the load is a sum of the first and second output currents; and
- during a second time period, while providing to the load the output current of the circuit at a second current level smaller than the first current level, operating the first half bridge to provide the first output current through its output while maintaining the second half bridge in an OFF state, such that during the second time period the total output current provided to the load is equal to the first output current.

16. The method of claim 15, wherein the circuit further comprises (i) a first inductor connected to the output of the first half bridge, (ii) a second inductor connected to the output of the second half bridge, and (iii) a main inductor connected to a node which is between a second side of the first inductor and a second side of the second inductor, and wherein an inductance of the main inductor is greater than an inductance of each of the first and second inductors.

17. The method of claim 16, wherein the first and the second inductors are inversely coupled to one another.

18. The method of claim 16, wherein the inductance of the main inductor is between 2 and 10 times greater than the inductances of each of the first and second inductors.

19. The method of claim 15, wherein a switching loss of the circuit during the second time period is approximately half the switching loss during the first time period.

* * * * *